United States Patent
Nishizawa et al.

[11] Patent Number: 6,156,259
[45] Date of Patent: Dec. 5, 2000

[54] METHOD OF MANUFACTURING PIEZOELECTRIC MATERIALS

[75] Inventors: Motoyuki Nishizawa; Mineharu Tsukada; Kaoru Hashimoto; Nobuo Kamehara, all of Kawasaki, Japan

[73] Assignee: Fujitsu Limited, Kawasaki, Japan

[21] Appl. No.: 08/540,028

[22] Filed: Oct. 6, 1995

Related U.S. Application Data

[63] Continuation of application No. 08/132,829, Oct. 7, 1993, abandoned.

[30] Foreign Application Priority Data

Oct. 8, 1992 [JP] Japan .................................. 4-270041
Aug. 4, 1993 [JP] Japan .................................. 5-193731

[51] Int. Cl.⁷ .................................................. C04B 33/32
[52] U.S. Cl. .......................... 264/620; 264/654; 264/658; 264/663
[58] Field of Search .................................. 264/620, 654, 264/658, 663

[56] References Cited

U.S. PATENT DOCUMENTS

| | | | |
|---|---|---|---|
| 4,803,763 | 2/1989 | Eturo et al. | 29/25.35 |
| 4,845,399 | 7/1989 | Yasuda et al. | 310/366 |
| 4,870,538 | 9/1989 | Baldwin et al. | 361/321 |
| 5,310,990 | 5/1994 | Russell et al. | 219/121.69 |
| 5,340,510 | 8/1994 | Bowen | 264/22 |

FOREIGN PATENT DOCUMENTS

58-102402  6/1993  Japan .
58-102403  6/1993  Japan .

OTHER PUBLICATIONS

Nomura et al., Dielectric and Piezoelectric Properties in the Ternary System of $Pb(Zn_{1/3}Nb_{2/3})O_3$–$Ba(Zn_{1/3}Nb_{2/3})O_3$–$PbTiO_3$, *Japanese Journal of Applied Physics*, vol. 11, No. 3, Mar. 1972, pp. 358–363.

Kuwata et al., "Phase Transistions in the $Pb(Zn_{1/3}Nb_{2/3})O_3$–$PbTiO_3$ System," *Ferroelectrics*, vol. 37, 1981, pp. 579–582.

Kuwata et al., "Dielectric and Piezoelectric Properties of $0.91Pb(Zn_{1/3}Nb_{2/3})O_3$–$0.09PbTiO_3$ Single Crystals," *Japanese Journal of Applied Physics*, vol. 21, No. 9, Sep. 1982, pp. 1298–1301.

Shrout et al., "Preparation of Lead–Based Ferroelectric Relaxors for Capacitors," *American Ceramic Society Bulletin*, vol. 66, No. 4, 1987, pp. 704–711.

Fujiu et al., "Processing of Perovskite $Pb(Zn_{1/3}Nb_{2/3})O_3$ by Hot Isostatic Pressing and Its Dielectric Properties," *Japanese Journal of Applied Physics*, vol. 30, No. 2B, Feb. 1991, pp. L298–L301.

Takenaka et al., "Piezoelectric Properties of $Pb(Zn_{1/3}Nb_{2/3})O_3$–$PbTiO_3$ Prepared by HIP," *Ferroelectrics*, vol. 134, 1992, pp. 133–138.

*Primary Examiner*—Christopher A. Fiorilla
*Attorney, Agent, or Firm*—Staas & Halsey LLP

[57] ABSTRACT

In a method of manufacturing piezoelectric ceramics by molding pre-fired or calcined powders of ingredients of a piezoelectric ceramic material and sintering the powder mold at a high pressure, the powder mold is pre-sintered at an atmospheric pressure before sintering at high pressure (HIP). Preferably, after the sintering HIP step, a thermal treatment is performed at a temperature of from 500 to 1000° C. under an oxidizing atmosphere. For a $Pb(Zn_{1/3}Nb_{2/3})O_3$—$PbTiO_3$ based piezoelectric ceramic, the composition is preferably set to $(Pb_{1-x}Ba_x)[(Zn_{1/3}Nb_{2/3})_{1-y}Ti_y]O_3$, where $0.001<x<0.055$ and $0.05<y<0.20$.

8 Claims, 7 Drawing Sheets

METHOD OF MANUFACTURING PIEZOELECTRIC MATERIALS

This application is a continuation, of application Ser. No. 08/132,829, filed Oct. 7, 1993, now abandoned.

BACKGROUND OF THE INVENTION a) Field of the Invention

The present invention relates to piezoelectric ceramics and a method of manufacturing the same.

b) Description of the Related Art

Single crystals of $xPb(Zn_{1/3}Nb_{2/3})O_3-(1-x) PbTiO_3$ (hereinafter called PZN—PT based single crystal) and $Pb(Zn_{1/3}Nb_{2/3})O_3$ (hereinafter called PZN based single crystal) are known as piezoelectric ceramic materials.

It is known that these materials have a high piezoeletric modulus in the perovskite structure and are excellent piezoelectric ceramic materials. It has been long desired to stinter the raw material to manufacture piezoelectric ceramics having the perovskite structure.

However, in these piezoelectric ceramic materials, an impurity phase or pyrochlore phase is easily formed. Sintering under a high pressure is therefore effective in order to suppress the generation of the pyrochlore phase.

In a conventional method, therefore, PZN or PZN—PT based piezoelectric ceramic material is provisionally fired to form powders. The powders are pressed to form a pressed powder mold. This pressed powder mold is sintered in a hot isostatic pressing (HIP) apparatus at a high pressure at a temperature of 800–1150° C. to manufacture a piezoelectric ceramic body.

Two-step processes for fabricating perovskite PZN and PZN—PT piezoelectric ceramics are disclosed in Japanese Journal of Applied Physics Vol.30, No.2B, 1991, L298-L301. "Processing of Perovskite $Pb(Zn_{1/3}Nb_{2/3})O_3$ by Hot Isostatic Pressing and Its Dielectric Properties" and Ferroelectrics. 1992, Vol.134. pp.133–138, "Piezoelectric Properties of $Pb(Zn_{1/3}Nb_{2/3})O_3$—$PbTiO_3$ Prepared by HIP". respectively.

In the former, perovskite PZN was fabricated from reagent-grade starting powders of PbO, ZnO and $Nb_2O_3$ by means of a two-step process. The first step was the formation of pyrochlore PZN under atmospheric pressure. The composition of the starting powders was stoichiometric PZN except that PbO content was increased by 5 wt % to the stoichiometric PbO to compensate for its loss during the heating process. The powders were mixed by ball-milling in deionized water with zirconia media for 16 hours. The slurry was dried and calcined in a covered alumina crucible at 850° C. for 1 h to form pyrochlore PZN. The calcined powders were ball-milled in deionized water with zirconia media for 12 h and dried at 120° C. for 24 hours. The second step was the conversion of pyrochlore PZN to perovskite PZN by applying high pressure at high temperature using HIP. Pyrochlore PZN powders were pressed as pellets (10 mm in diameter and 2 to 4 mm in thickness) under 100 MPa. Various pressures (100–200 MPa) were applied to the pellets at various temperatures (800–1150° C.) under Ar atmosphere using a commercial HIP.

In the latter, the first step is the formation of pyrochlore PZN—PT powders under atmospheric pressure with 5 wt % excess PbO from reagent-grade starting powders of PbO, ZnO, $Nb_2O_3$ and $TiO_2$. The second step is the conversion-step of the pyrochlore PZN—PT to the perovskite PZN—PT by applying high pressure (150–200 MPa) at high temperature (1150–1200° C.) using a commercial HIP.

In another known method of sintering PZN—PT based piezoelectric ceramic material at an atmospheric pressure, lead (Pb) is replaced by another element such as barium (Ba). For example, a fraction of lead is replaced by barium (Ba). A pressed powder mold made of this material is sintered at an atmospheric pressure to manufacture piezoelectric ceramics. These ceramics have a high piezoelectric modulus. The replacement or substitution of Pb by barium is usually 6 to 7 mol % or more.

It is disclosed in Japanese Journal of Applied Physics Vol. 11, No. 3, 1972, pp. 358–364. "Dielectric and Piezoelectric Properties in the Ternary System of $Pb(Zn_{1/3}Nb_{2/3})O_3Ba(Zn_{1/3}Nb_{2/3})O_3$—$PbTiO_3$, that in the vicinity of $Pb(Zn_{1/3}Nb_{2/3})O_3$, two phases of perovskite (ferroelectric) and pyrochlore (non-ferroelectric) types are coexistant, and the planar coupling factor reaches 0.44, for the composition of $0.8 Pb(Zn_{1/3}Nb_{2/3})O_3$—$0.2Pb_{0.7}Ba_{0.3}(Zn_{0.1}Nb_{0.2}Ti_{0.7})O_3$.

The samples were prepared by using PbO, $BaCO_3$, ZnO $Nb_2O_5$ and $TiO_2$ (>99.5% purity). The batches were calcined in a platinum crucible at 900° C. for 10–20 hours. The calcined ones were ground, pressed into disks (18 mm in diameter), then sintered at 1100° C. for 3 hours. To obtain uniform ceramics, the cycle was repeated again, and finally sintered at 1100–1200° C. for 2–3 hours, depending on the compositions. In the system containing $Pb(Zn_{1/3}Nb_{2/3})O_3$ the sintering was also done at a lower temperature for a longer period than described above, at 960° C. for 15 hours, in order to suppress the formation of the second phase.

Further, it is disclosed in Am. Ceram. Soc. Bull., 66[4] 704–711,1987 "Preparation of Lead-Based Ferroelectric Relaxors for Capacitors" that their high dielectric constants, broad maxima, and relatively low firing temperatures have made them promising candidate materials for multilayer ceramic capacitors. However, such materials are difficult to fabricate reproducibly without the appearance of a pyrochlore phase that can be detrimental to the dielectric properties. The kinetics and thermodynamics of the perovskite vs pyrochlore formation is also reviewed.

The conventional manufacturing method suppresses the generation or formation of the pyrochlore phase by using high pressures sintering. However, high pressure gas is enclosed or entrapped within the disconnected pores in a sintered body of the piezoelectric ceramic body. When the sintered body is taken out from the HIP apparatus and exposed to atmospheric pressure after the HIP process, the pores expand and the sintered body is destroyed. So, a fine and dense sintered body cannot be manufactured. The sintered body may be broken by itself because of the expansion and burst of the high pressure pores.

In the case of the method of manufacturing piezoelectric ceramics by substituting barium for lead, a self-destruction of a sintered body will not occur because the sintering is performed at the atmospheric pressure. However, the Curie temperature is lowered, hindering the use of the sintered body under a high temperature environment compared with no substitution of the Ba ion the Pb ion.

SUMMARY OF THE INVENTION

It is an object of the present invention to provide a method of manufacturing piezoelectric ceramics which are free from self-destruction, capable of suppressing the formation of the pyrochlore phase and the lowering of the Curie temperature.

According to one aspect of the present invention, there is provided a method of manufacturing piezoelectric ceramics by molding pre-fired powders of piezoelectric ceramic material and sintering the powder mold at a high pressure, the powder mold being pre-sintered at an atmospheric pressure before the sintering at the high pressure process.

By pre-sintering at the atmospheric pressure before sintering at the high pressure, open pores in the powder mold before the pre-sintering can be changed into closed pores containing atmospheric pressure gas after the pre-sintering. Accordingly, almost all open pores which could become closed pores during high pressure sintering (HIP), are removed.

High pressure gas will not enter, during the high pressure sintering, into the closed pores formed in the pre-sintering process under the atmospheric pressure. Therefore, the closed pores of high pressure gas are scarcely present in the finally sintered body after the high pressure sintering (HIP) process, so that piezoelectric ceramics having a high density and being free of self-destruction can be manufactured.

Preferably, the composition of the pre-fired powders are xPb $(Zn_{1/3}Nb_{2/3})O_3$–$(1-x)$ $PbTiO_3$ where $0.7<x<=1$, where $<=$ represents $<$ or $=$. Preferably, the temperature of the pre-sintering of the ingredients or precursor for the ceramics is set to 900 to 1100° C.

For $Pb(Zn_{1/3}Nb_{2/3})O_3$—$PbTiO_3$ based piezoelectric ceramic, 0.1 to 10 mol % of Pb elements may be replaced by barium (Ba) elements. Preferably, after burning the powder mold at the high pressure (i.e., after the HIP process), the mold is subjected to a thermal treatment at a temperature from 500 to 1000° C. under an oxidizing atmosphere.

By the thermal treatment under the oxidizing atmosphere after the high pressure sintering (HIP), it is possible to oxidize the sintered body to the oxidized state again, which sintered body may be deoxidized or reduced from the stoichiometric composition of the ceramics at the high pressure sintering, piezoelectric ceramics having good piezoelectric characteristics can be manufactured.

According to another aspect of the present invention, there is provided a method of manufacturing piezoelectric ceramics comprising the steps of: pre-firing at a temperature from 400 to 1000° C. piezoelectric ceramic material or ingredients (or precursor) thereof having the composition of $(Pb_{1-x}Ba_x)[(Zn_{1/3}Nb_{2/3})_{1-y}Ti_y]O_3$, where $0.001<x<0.055$ and $0.05<y<0.20$ to produce pre-fired powders: pressing the pre-fired powders into a powder mold; and sintering the powder mold at a temperature in the range of from 850 to 1200° C.

By setting the composition to $(Pb_{1-x}Ba_x)[(Zn_{1/3}Nb_{2/3})_{1-y}Ti_y]O_3$, where $0.001<x<0.055$ and $0.05<y<0.20$, by setting the pre-firing temperature in the range of from 400 to 1000° C., and by setting the sintering temperature in the range of from 850 to 1200° C., it is possible to manufacture piezoelectric ceramics at an atmospheric pressure, which has a high perovskite phase formation ratio.

According to another aspect of the present invention, there are provided piezoelectric ceramics of $Pb(Zn_{1/3}Nb_{2/3})O_3$—$PbTiO_3$ based material and, the piezoelectric ceramics having the composition of $(Pb_{1-x}Ba_x)[(Zn_{1/3}Nb_{2/3})_{1-y}Ti_y]O_3$, where $0.001<x<0.055$ and $0.05<y<0.20$.

DETAILED DESCRIPTION OF THE PREFERRED EMBODIMENTS

Figure 1:
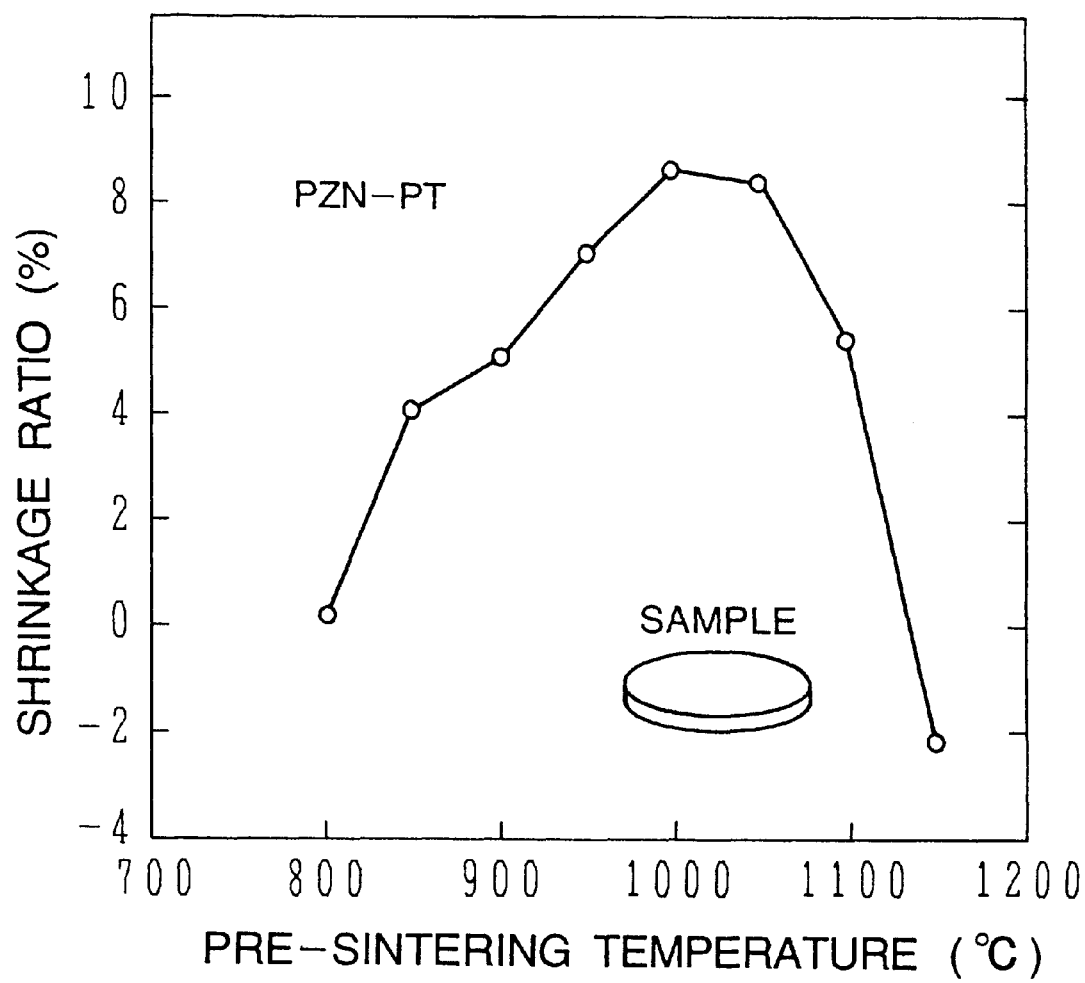
FIG. 1 is a graph showing a shrinkage ratio of a pressed powder mold after the pre-sintering relative to a pre-sintering temperature, for the PZN—PT based material.

A method of manufacturing piezoelectric ceramics by using PZN—PT based material according to a first embodiment of the present invention will be described hereinafter.

First Embodiment

The starting or raw material powders of PbO, ZnO, $Nb_2O_5$, and $TiO_2$ were mixed in a mortar. The mixing ratio of these ingredients is adjusted to a composition 0.91 $Pb(Zn_{1/3}Nb_{2/3})O_3$—0.09 $PbTiO_3$. The mixed composition of these ingredients was pre-fired or calcined for 2.5 hours at 850° C. to obtain pre-fired powders of both the perovskite and the pyroclhore phases. Polyvinyl butyl (PVB) as a binder was added to the pre-fired powders with ethyl alcohol, at the ratio of 1.5 g PVB and 100 cc ethyl alcohol per 150 g powders. The powder particles bounded by the binder were formed by the mortar and dried thereafter.

The bonded powder particles were pressed by a metal mold of 20 mm diameter to obtain a pressed powder mold of a disk shape of about 2 mm thickness. This pressed powder mold was pre-sintered for 2 hours at 1000° C. in an atmospheric furnace. The pre-sintered powder mold is considered to still have both the pyrochlore and perovskite phases. Thereafter, the pre-sintered powder mold was subjected to a HIP treatment for 1 hour under the conditions of 1170° C. and 200 MPa in an apparatus or furnace capable of heating and isostatically pressing, such as a hot isostatic pressing (HIP) apparatus, by using inert gas such as Ar as the pressuring medium.

As a result, a fine and dense sintered body of the piezoelectric ceramics was manufactured which is free from self-destruction, even after it is subjected to the HIP process and taken out from the HIP apparatus to the atmospheric pressure. The sintered body has a sintered density of 7.5 g/cm$^3$ (89.4% of theoretical density) and the formation ratio of perovskite phase of 84.7%. It is preferable to use a composition ratio 70 to 100% of $Pb(Zn_{1/3}Nb_{2/3})O_3$. The piezoelectric characteristic may be degraded if the composition ratio of $Pb(Zn_{1/3}Nb_{2/3})O_3$ is reduced below 70%.

Second Embodiment

A method of manufacturing piezoelectric ceramics by using PZN based material according to the second embodiment of the present invention will be described.

The starting powders for forming piezoelectric ceramics of PbO, ZnO, and $Nb_2O_5$ were mixed in a mortar, the composition of these components being prepared or adjusted to a composition $Pb(Zn_{1/3}Nb_{2/3})O_3$. The sintered body was manufacture in a manner like the first embodiment.

As a result, a fine and dense sintered body of the piezoelectric ceramics was manufactured, which is free from self-destruction under atmospheric pressure after the HIP process and which has a sintered density of 7.4 g/cm$^3$ (87.4% of theoretical density) and the perovskite phase of 94.3%.

Sintered bodies of the piezoelectric ceramics were manufactured in the manner like the first and second embodiments by changing only the pre-sintering temperature. The experimental, results are given in the following.

Figure 2:
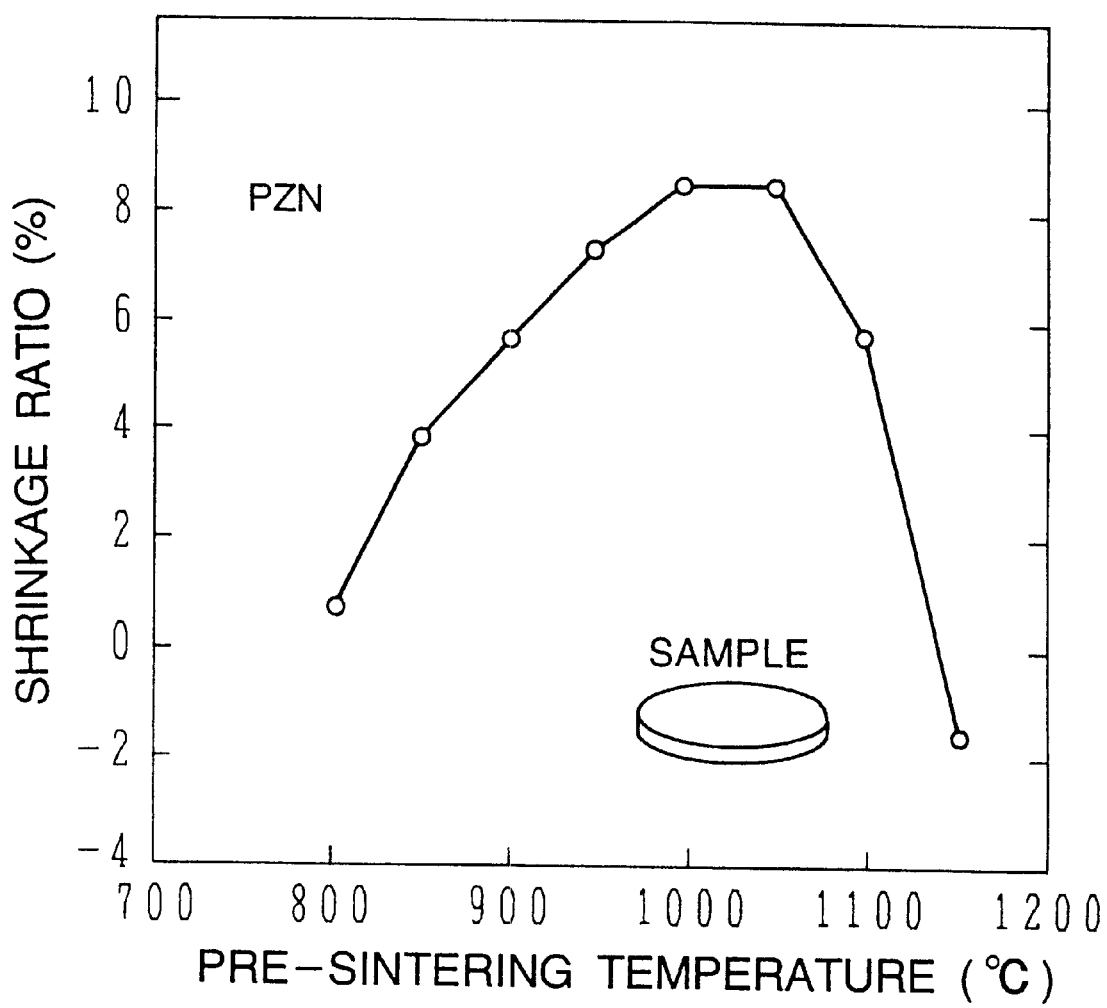
FIG. 2 is a graph showing a shrinkage ratio of a pressed powder mold after the pre-sintering relative to a pre-sintering temperature, for the PZN based material.

FIGS. 1 and 2 are graphs showing a shrinkage ratio of a pressed powder mold after the pre-sintering relative to a pre-sintering temperature, respectively for the PZN—PT based material and PZN based material. The abscissa represents a pre-sintering temperature, and the ordinate represents a shrinkage ratio. The shrinkage ratio takes a maximum value of about 8% at the pre-sintering temperature of 1000° C., for both the PZN—PT and PZN based materials. The shrinkage ratio lowers to about 5% or less and to about 6% or less, respectively at the pre-sintering temperatures of 900° C. or lower and 1100° C. or higher for both PZN—PT and PZN systems.

This means that the number of pores is minimized at the pre-sintering temperature of about 1000° C. Therefore, if the pre-sintering temperature is set within a range of from 900° C. to 1100° C., the pressed powder mold is made most dense by the pre-sintering. It is therefore conceivable that the number of open pores which may be enclosed or entrapped in the sintered body and become closed pores during the high pressure pressing or sintering (HIP) process, is reduced.

Because of the reduction in the number of open pores which may be enclosed or entrapped in the sintered body and which may become closed pores during the high pressure pressing or sintering (HIP) process, the number of high pressure pores entrapped in the resultant sintered body is small, resulting in a dense sintered body free from self-destruction under atmospheric pressure after the HIP process.

Figure 3:
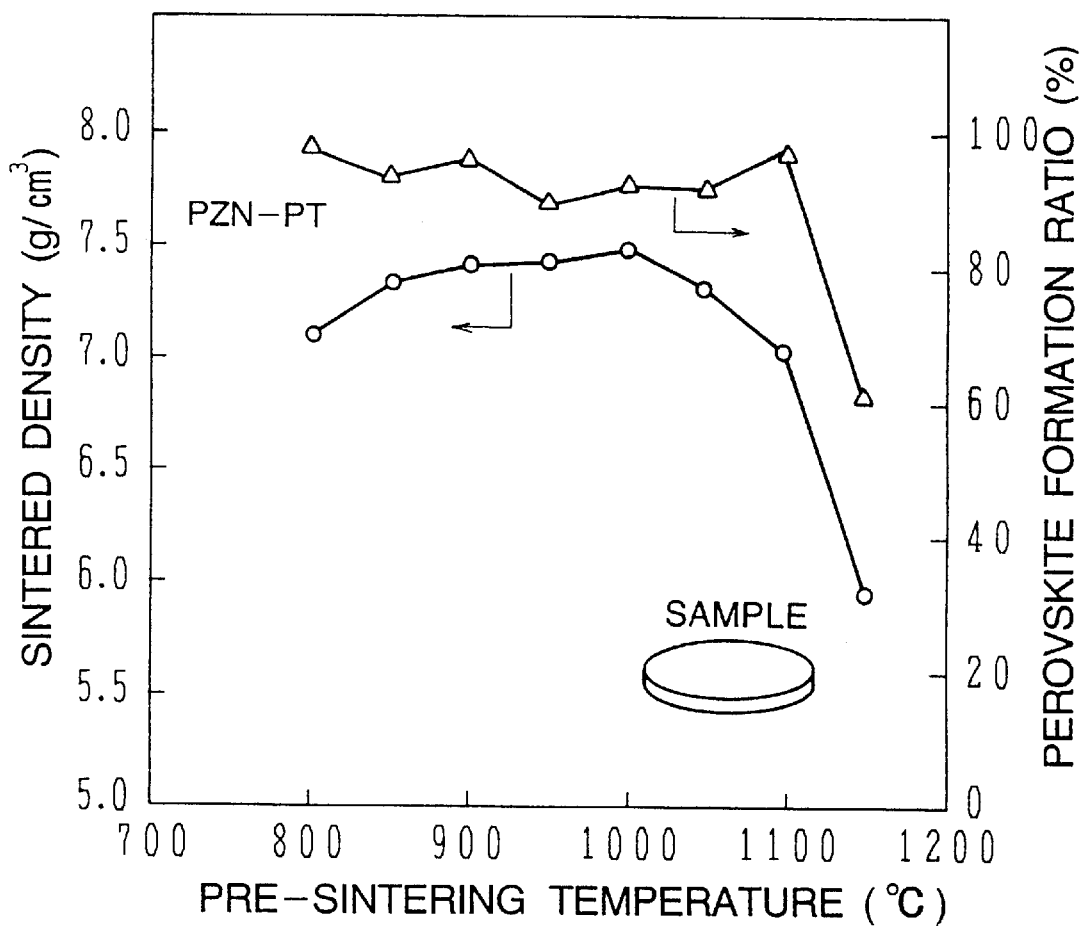
FIG. 3 is a graph showing the sintered density and perovskite formation ratio of a sintered body after high pressure sintering (HIP) relative to a pre-sintering temperature, for the PZN—PT based material.
Figure 4:
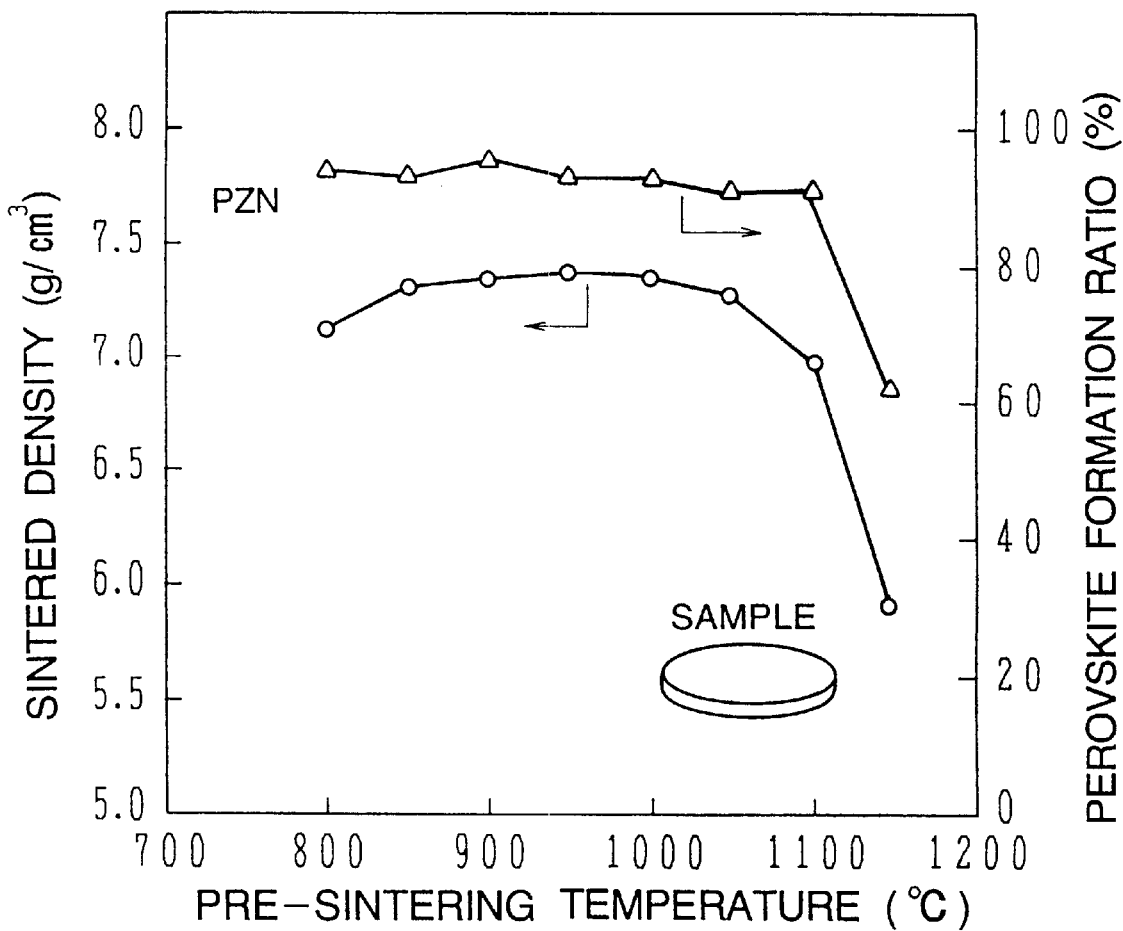
FIG. 4 is a graph showing the sintered density and perovskite formation ratio of a sintered body after high pressure sintering relative to a pre-sintering temperature, for the PZN based material.

FIGS. 3 and 4 are graphs showing the sintered density and perovskite formation ratio of a sintered body after a high pressure pressing or sintering (HIP) process relative to a pre-sintering temperature, respectively for the PZN—PT and PZN based materials. The abscissa represents the pre-sintering temperature, the left ordinate represents the density of a sintered body after the HIP process, and the right ordinate represents the perovskite formation ratio.

As seen from the graphs, If the pre-sintering temperature is set within a range of from 900 to 1100° C., a sintered body having a high sintered density of about 7.1–7.5 for FIG. 3 and of about 7.0–7.4 for FIG. 4, and a perovskite formation ratio of 90% or higher i.e., about 91–97% for FIG. 3 and abut 91–96% for FIG. 4 can be manufactured similar to the above first and second embodiments.

Since the perovskite formation ratio is in excess of 90%, the sintered body of the piezoelectric ceramics has a high piezoelectric modulus. The pre-sintering temperature in the range of from 900 to 1100° C. is therefore optimum.

This may be reasoned as follows. In the case of general ceramic materials, the density of a sintered body becomes higher as the sintering temperature is raised. However, in the case of PZN and PZN—PT based piezoelectric ceramic materials, the pyrochlore phase starts being formed at a temperature over 1000° C., and at a temperature over 1100° C., crystals of the pyrochlore phase presenting no piezoelectricity grow large, preventing a densely shrunk state even by high pressure sintering.

In the above embodiments, the pre-sintering was performed in an atmospheric pressure furnace. The pre-sintering may be performed in a hot isostatic pressing (HIP) apparatus at an atmospheric pressure. In this case, the pre-sintering and high pressure sintering can be performed continuously in the same HIP apparatus, reducing the labor such as transport of the pre-sintered body.

Although the pre-sintering was performed at an atmospheric pressure in the above embodiments, the pre-sintering may also be performed under a pressure not exceeding a several-fold atmospheric pressure. Also in this case, piezoelectric ceramics free from self-destruction and having a high density can be manufactured.

For comparison with the embodiments, piezoelectric ceramics were manufactured by sintering at a high pressure without pre-sintering of the powder mold.

Similar to the first embodiment, the starting material powders of PbO, ZnO, Nb$_2$O$_5$, and TiO$_2$ were mixed in a mortar, the composition of these ingredients being prepared to a composition of 0.91 Pb(Zn$_{1/3}$Nb$_{2/3}$)O$_3$—0.09 PbTiO$_3$ after sintering thereof. Mixed components or ingredients were pre-fired for 2.5 hours at 850° C. to obtain pre-fired powders of both the perovskite and the pyroclhore phases. Polyvinyl butyl (PVB) as a binder and ethyl alcohol for dispersion agent were added to the pre-fired or calcined powders, at the ratio of 1.5 g PVB and 100 cc ethyl alcohol per 150 g powders. The powder particles bonded by the binder were formed by the mixer or mortar and dried thereafter.

The bonded powder particles were pressed by a metal mold of 20 mm diameter to obtain a pressed powder mold of a disk shape of about 2 mm thickness. Thereafter, without pre-sintering under the atmospheric furnace, the pressed powder mold was subjected to the HIP process and sintered for 1 hour under the conditions of 1170° C. and 200 MPa in a hot isostatic pressing (HIP) apparatus, by using inert gas such as Ar as the pressuring medium.

A sintered body having a high density and being free from self-destruction after the HIP process could not be manufactured. The obtained sintered body was broken when taken out from the HIP apparatus to the atmospheric pressure by the expansion and burst of high pressure closed pores within the sintered body.

Similar to the second embodiment, a sintered body having a composition of Pb(Zn$_{1/3}$Nb$_{2/3}$)O$_3$ was manufactured without pre-sintering. Similar to the above example, a sintered body having a high density and being free from self-destruction could not be manufactured. The obtained sintered body was broken under an atmospheric pressure by the expansion and burst of high pressure closed pores within the sintered body.

Piezoelectric ceramics free of self-destruction can be manufactured by using a PZN or PZN—PT based material by the method described in the first and second embodiments. However, because the material is sintered in the hot isostatic pressing (HIP) apparatus under the Ar atmosphere, the material is deoxidized (i.e., oxygen deficient state) from the stoichiometric composition of the piezoelectric ceramics and the sample is colored black. The piezoelectric characteristic may possibly be deteriorated. In the following, a method of oxidizing the black colored sample again and recovering the inherent piezoelectric characteristic will be described.

Third Embodiment

The raw material powders of PbO, BaO, ZnO, Nb$_2$O$_5$, and TiO$_2$ were mixed in a mixer, the composition of these ingredients being prepared to a composition of $(Pb_{0.06}Ba_{0.05})[(Zn_{1/3}Nb_{2/3})_{0.88}Ti_{0.12}]O_3$ after sintering. Mixed ingredients were pre-fired for 2.0 hours at 800 °C. to obtains pre-fired or calcined powders. Polyvinyl butyl (PVB) as a binder and ethyl alcohol were added to the pre-fired powders. The binder was 1 weight %. The powder particles bonded by the binder were formed by the mixer and dried thereafter.

The bonded powder particles were pressed by a metal mold of 20 mm diameter to obtain a pressed powder mold of a disk shape of about 2 mm thickness. The pressing conditions were a temperature of 60° C., a pressure of 200 MPa, and a molding time of 30 minutes.

Thereafter, the powder mold was pre-sintered at 950° C. for 2 hours in an atmospheric furnace. Next, the body removed of the binder was subjected to a HIP treatment and sintered for 1 hour under the conditions of 950° C. and 160 MPa in a furnace capable of heating and isostatically pressing. such as a hot isostatic pressing (HIP) apparatus, by using inert gas such as Ar as the pressuring medium. The obtained sample had been colored black.

The obtained sample was subjected to a thermal treatment or annealed in the air for 15 minutes at 600° C. in the atmospheric pressure furnace. The sample after the thermal treatment had been colored its original yellow. The manufactured piezoelectric ceramics had a relative dielectric constant $\in=4550$, an electromechanical coupling coefficient kr=45.1%, and a piezoelectric modulus $d_{30}=503$ pm/V.

The sample which has been subjected to the high pressure sintering under the same conditions as the third embodiment, but which has not been subjected to the thermal treatment under an atmospheric pressure in the air, is deoxidized (oxygen deficient state) and colored black. This sample has a relative dielectric constant $\in=4130$, an electromechanical coupling coefficient kr=43.8%. and a piezoelectric modulus $d_{30}=473$ pm/V. By oxidizing again the deoxidized sample by the thermal treatment in the oxidizing atmosphere, the relative dielectric constant, electromechanical coupling coefficient, and piezoelectric modulus could be improved.

It is preferable to set the ratio of Ba to Pb to a value from 0.1 to 10% in order to obtain a stable perovskite structure. The thermal treatment for the oxidization in an atmospheric pressure furnace is preferably performed at a temperature from 500 to 1000° C.

In the above embodiment, PZN—PT based piezoelectric ceramics have been described. The same effects can be obtained for PZN based piezoelectric ceramics.

Fourth Embodiment

In the first to third embodiments, high pressure sintering has been described. Sintering at atmospheric pressure can be performed by properly selecting the composition of material components and the sintering temperature.

The starting powders of PbO, BaO, ZnO, $Nb_2O_5$, and $TiO_2$ were mixed in a mixer, the composition of these starting components being prepared to a composition after sintering to $(Pb_{1-x}Ba_x)[(Zn_{1/3}Nb_{2/3})_{0.8}Ti_{0.12}]O_3$. Mixed components were pre-fired for 2.0 hours at 750° C. to obtain pre-fired powders. Polyvinyl butyl (PVB) as a binder and a solvent such as ethyl alcohol were added to the pre-fired powders, at the ratio of 1.5 g PVB and 100 cc ethyl alcohol per 150 g powders. The bonded powder particles were formed by the mixer and dried thereafter.

The bonded powder particles were pressed by a metal mold of 20 mm diameter to obtain a pressed powder mold of a disk shape of about 2 mm thickness. The powder mold was sintered for 2 hours at 1100° C. in the air in an atmospheric pressure furnace.

Figure 7:
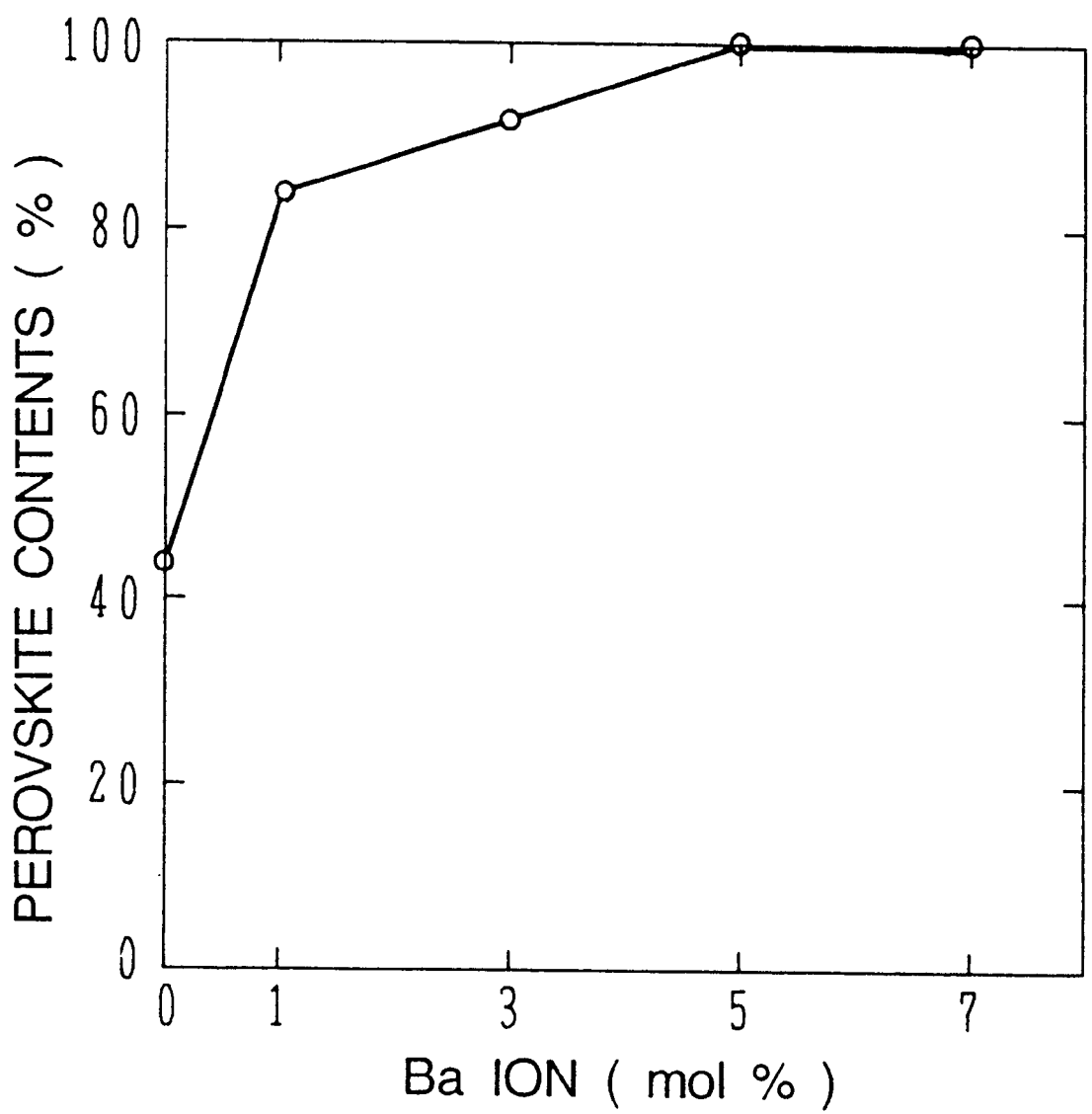
FIG. 7 is a graph showing the effects of substituting Pb-ions with Ba-ions.

FIG. 7 is a graph showing the perovskite formation ratio of sintered bodies after sintering in an atmospheric pressure furnace relative to a substituting ratio of Pb-ion with Ba-ion. Substituting ratios with Ba-ion are 0, 1, 3, and 7 mol %. As the substituting ratio with Ba-ion is higher, the pyrochlore formation ratio becomes lower. A perovskite formation ratio of almost 100% can be manufactured at the substituting ratio of 5 mol % or higher.

Moreover, by properly selecting the sintering condition, a perovskite formation ratio of almost 100% could be obtained even at the substituting ratio of 1 mol % with Ba-ions.

Figure 5:
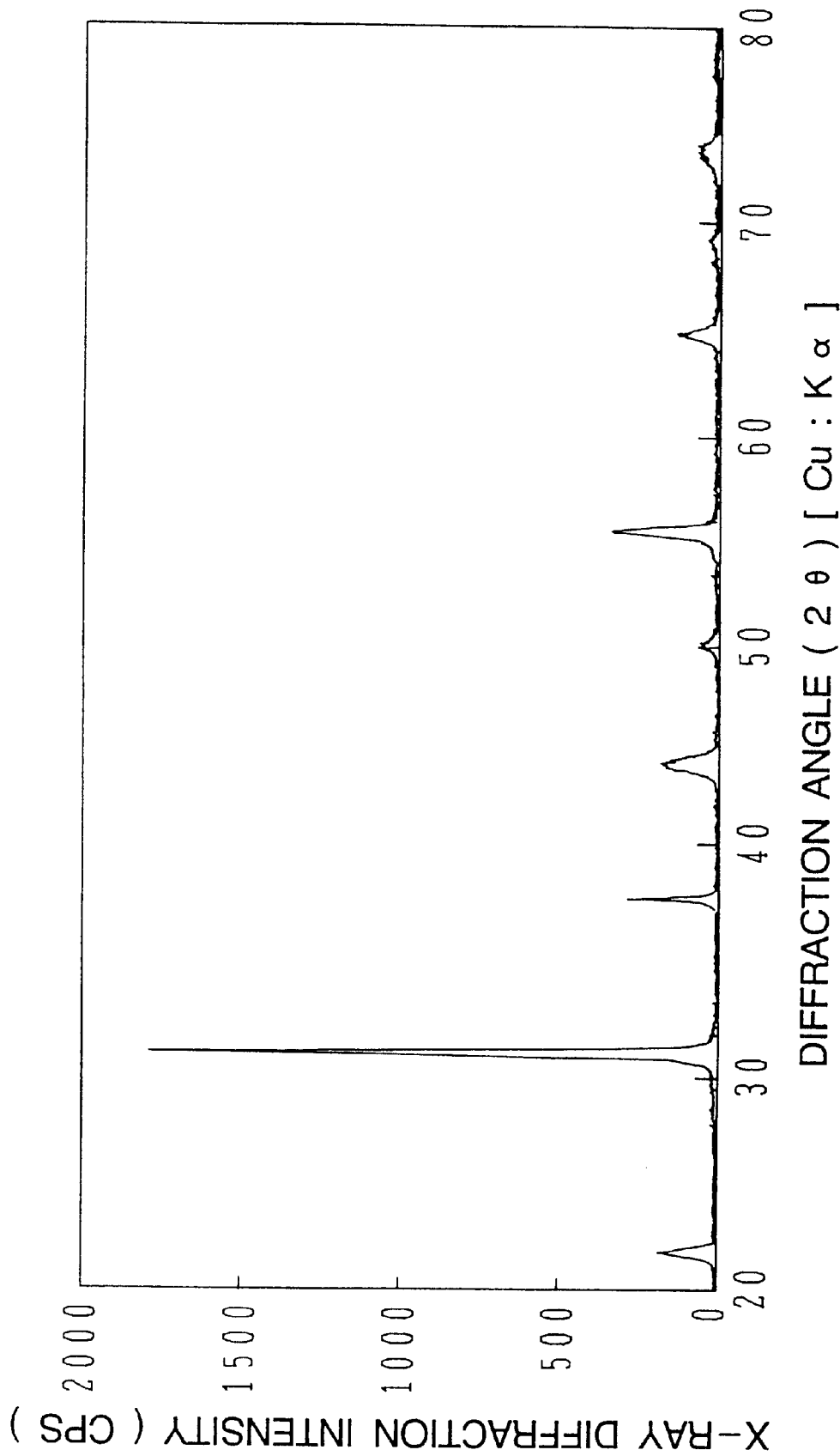
FIG. 5 is a graph showing the X-ray diffraction results of PZN—PT based piezoelectric ceramics manufactured by the method according to the fourth embodiment of the present invention.

FIG. 5 is a graph showing the X-ray diffraction results of a sintered body manufactured under the above-described conditions and at the substituting ratio of 1 mol % with Ba-ion, i.e. x=0.01. A peak near 31° indicates the formation of the perovskite phase. A peak is not generated near 29°, indicating no formation of the pyrochlore phase. The sintered density was 7.5 g/cm$^3$ (about 90% of a theoretical density) and the piezoelectric modulus was $d_{30}=62.5$ pm/V.

Figure 6:
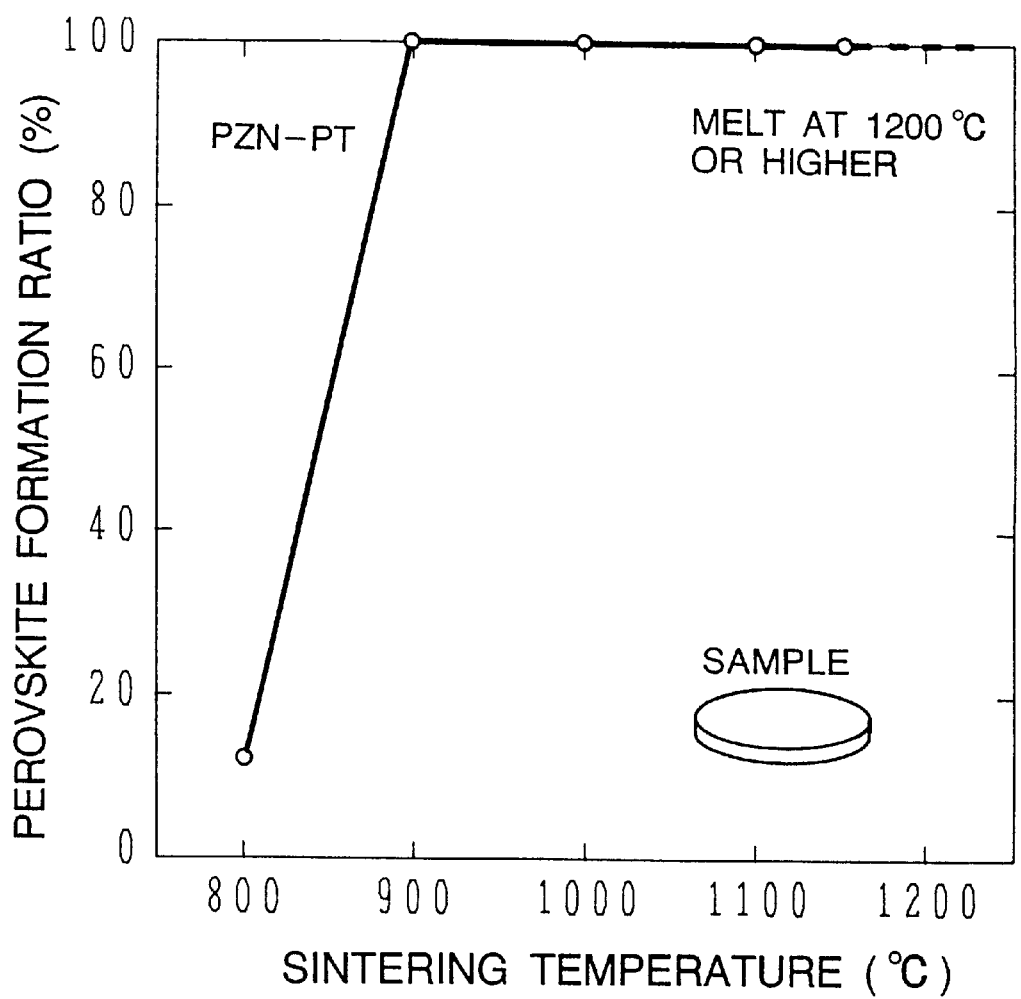
FIG. 6 is a graph showing the perovskite formation ratio of PZN—PT based piezoelectric ceramics manufactured by the method according to the fourth embodiment of the present invention, relative to the sintering temperature.

FIG. 6 is a graph showing the perovskite formation ratio relative to the sintering temperature. At the sintering temperature of 800° C., the perovskite phase is hardly formed and is 20% or less. At the sintering temperature from 900° C. to 1200° C., the perovskite phase is formed almost 100%. At the sintering temperature of 1200° C. or higher, the sample is melted down. It is preferable therefore to set the sintering temperature within a range of from 850° C. at the lowest to 1200° C. at the highest.

As described above, PZN—PT based piezoelectric ceramics of a stable perovskite structure can be manufactured by properly setting the composition of components, pre-firing or calcining temperature, pre-sintering temperature, and sintering temperature, and when adopted substituting ratio of Pb element with Ba element. The stable perovskite structure may be reasoned from a geometric stability caused by an increased ion coupling ability due to a large electro-negativity difference between positive ions on A-site and oxygen ions, and by a change in average radius of positive ions on A-site.

For the manufacture of piezoelectric ceramics having stable perovskite structure and a high piezoelectric modulus, it is preferable to set the ratio (x) of Ti to $(Zn_{1/3}Nb_{2/3})$ to from 5 To 20 mol % and the ratio (y) of Ba to Pb to from 0.1 to 5.5 mol %. In this case, the mol ratio of Ba is smaller than a conventional ratio. Therefore, it is possible to suppress the lowering of the Curie temperature.

The pre-firing or calening temperature may be 400 to 1000° C. The effects of pre-firing are not retained at the temperature of 400° C. or lower. At the temperature of 1000° C. or higher, the density of the sample after sintering may be lowered and the formation of the perovskite phase over the entirety of the sample may be hindered.

The present invention is not limited only to the embodiments described above, and various substitutions, modifications, improvements, or combinations may be made easily by those skilled in the art within the scope and spirit of the appended claims.

We claim:

1. A method of manufacturing a ceramic sintered body, comprising:
   molding a pre-fired piezoelectric ceramic material consisting essentially of lead zincate niobate (PZN) or lead zincate-niobate-lead titanate (PZN—PT) having a composition of $x\text{Pb}(\text{Zn}_{1/3}\text{Nb}_{2/3})\text{O}_3-(1-x)\text{PbTiO}_3$, where $0.7 < x \leq 1$, into a powder mold;

pre-sintering said powder mold at an atmospheric pressure and at a temperature of from 900° C. to 1100° C. to close pores; and sintering said pre-sintered powder mold by hot high pressure isostatic pressing (HIP) to manufacture a ceramic sintered piezoelectric body.

2. A method according to claim 1, further comprising, after said sintering, performing a thermal treatment on said ceramic sintered piezoelectric body at a temperature of from 500 to 1000° C. under an oxidizing atmosphere.

3. A method according to claim 1, wherein said pre-fired piezoelectric ceramic material has a composition of $\text{Pb}(\text{Zn}_{1/3}\text{Nb}_{2/3})\text{O}_3$.

4. A method according to claim 3, further comprising, after said sintering, performing a thermal treatment on said ceramic sintered piezoelectric body at a temperature of from 500 to 1000° C. under an oxidizing atmosphere.

5. A method according to claim 1, wherein said piezoelectric ceramic material is $\text{Pb}(\text{Zn}_{1/3}\text{Nb}_{2/3})\text{O}_3$—$\text{PbTiO}_3$ based piezoelectric ceramic, where 0.1 to 10 mol % of Pb element is replaced by a barium (Ba) element.

6. A method of manufacturing a ceramic sintered body, comprising:

pre-firing a piezoelectric ceramic material having a composition of $(\text{Pb}_{1-x}\text{Ba}_x)((\text{Zn}_{1/3}\text{Nb}_{2/3})_{1-y}\text{Ti}_y)\text{O}_3$, where $0.001 < x < 0.055$ and $0.05 < y < 0.20$, at a temperature of from 400 to 1000° C.;

pressuring the piezoelectric ceramic material to produce a powder mold; and sintering said powder mold at a temperature from 850 to 1200° C.

7. A method of manufacturing a ceramic sintered body, comprising:

molding pre-fired piezoelectric ceramic material having a composition of $x\text{Pb}(\text{Zn}_{1/3}\text{Nb}_{2/3})\text{O}_3-(1-x)\text{PbTiO}_3$ where $0.7 < x \leq 1$, into a powder mold;

pre-sintering said powder mold at an atmospheric pressure and at a temperature from 900 to 1000° C. to close pores; and sintering said pre-sintered powder mold by hot high pressure isostatic pressing (HIP) to manufacture a ceramic sintered piezoelectric body.

8. A method of manufacturing a ceramic sintered body, comprising:

molding pre-fired piezoelectric ceramic material having a composition of $\text{Pb}(\text{Zn}_{1/3}\text{Nb}_{2/3})\text{O}_3$ into a powder mold;

pre-sintering said powder mold at an atmospheric pressure and at a temperature from 900 to 1000° C. to close pores; and sintering said pre-sintered powder mold by hot high pressure isostatic pressing (HIP) to manufacture a ceramic sintered piezoelectric body.

* * * * *